United States Patent [19]
Redwine

[11] Patent Number: 5,109,258
[45] Date of Patent: Apr. 28, 1992

[54] MEMORY CELL MADE BY SELECTIVE OXIDATION OF POLYSILICON

[75] Inventor: Donald J. Redwine, Houston, Tex.

[73] Assignee: Texas Instruments Incorporated, Dallas, Tex.

[21] Appl. No.: 220,425

[22] Filed: Jul. 13, 1988

Related U.S. Application Data

[60] Continuation of Ser. No. 85,286, Aug. 11, 1987, abandoned, which is a continuation of Ser. No. 815,266, Dec. 24, 1985, abandoned, which is a continuation of Ser. No. 400,557, Jul. 21, 1982, abandoned, which is a division of Ser. No. 147,433, May 7, 1980, Pat. No. 4,441,246.

[51] Int. Cl.⁵ .................. H01L 29/68; H01L 29/04; H01L 27/02; H01L 21/70
[52] U.S. Cl. .................. 357/23.6; 357/59; 357/51; 437/52
[58] Field of Search .......... 357/23.6, 59 I, 51; 437/52

[56] References Cited

U.S. PATENT DOCUMENTS

| | | | |
|---|---|---|---|
| 3,740,731 | 6/1973 | Ohwada et al. | 340/173 CA |
| 3,740,732 | 6/1973 | Frandon | 340/173 R |
| 3,852,800 | 12/1974 | Ohwada et al. | 357/24 |
| 4,112,575 | 9/1978 | Fu et al. | 357/41 |
| 4,125,933 | 11/1978 | Baldwin et al. | 29/571 |
| 4,141,027 | 2/1979 | Baldwin et al. | 357/51 |
| 4,163,243 | 7/1979 | Kamins et al. | 357/23.6 |
| 4,164,751 | 8/1979 | Tasch, Jr. | 357/41 |
| 4,210,473 | 7/1980 | Takagi et al. | 357/59 |
| 4,219,379 | 8/1980 | Athanas | 357/59 |
| 4,240,195 | 12/1980 | Clemens et al. | 357/23.6 |
| 4,329,704 | 5/1982 | Sakurai et al. | 357/23.6 |
| 4,329,706 | 5/1982 | Crowder | 357/59 I |
| 4,460,911 | 7/1984 | Salters | 357/23.6 |

OTHER PUBLICATIONS

IBM Technical Disclosure Bulletin, vol. 18, #10, p. 3288, by Abbas, Mar. 1976.
IBM Technical Disclosure Bulletin, vol. 21, #21, pp. 3823-3824, by Rideout, Feb. 1979.

*Primary Examiner*—Mark Prenty
*Attorney, Agent, or Firm*—Robby T. Holland; René E. Grossman; Richard L. Donaldson

[57] ABSTRACT

A dynamic read/write memory cell for the one transistor N-channel silicon gate type is made by an improved process employing selective oxidation of polysilicon using PN junction capacitors. A relatively flat surface results from the process, which is favorable to patterning small geometries. The PN junction storage capacitors have improved alpha particle protection. Metal-to-polysilicon gate contacts are made at silicide areas over polysilicon gates; the silicide lowers resistance of the poly elements.

10 Claims, 2 Drawing Sheets

MEMORY CELL MADE BY SELECTIVE OXIDATION OF POLYSILICON

This application is a continuation of application Ser. No. 07/085,286 filed Aug. 11, 1987 and now abandoned, which is a continuation of application Ser. No. 06/815,266 filed Dec. 24, 1985 and now abandoned, which is a continuation of application Ser. No. 06/400,557 filed Jul. 21, 1982 and now abandoned, which is a divisional of application Ser. No. 06/147,433 filed May 7, 1980 and now U.S. Pat. No. 4,441,246.

BACKGROUND OF THE INVENTION

This invention relates to semiconductor memory devices and methods of manufacture, and more particularly to a one-transistor dynamic read/write memory of the N-channel silicon gate type.

Dynamic read/write memory cells made by the double-level polysilicon N-channel self-aligned process commonly used in the industry are shown in pending U.S. Pat. applications Ser. No. 648,594, filed Jan. 12, 1976 and now abandoned, and Ser. No. 722,841, filed Sept. 13, 1976 and now U.S. Pat. No. 4,240,092, by C-K Kuo, both assigned to Texas Instruments, as well as in Electronics, Feb. 19, 1976, pp. 116-121, May 13, 1976, pp. 81-86, and Sept. 28, 1978, pp. 109-116.

One of the continuing problems with the standard dynamic RAM cell is that of thin oxide failures. Both the transistor and the capacitor in each cell are polysilicon layers separated from the silicon by thin silicon dioxide. As the bit density increases the cell geometries are scaled down, thus requiring thinner oxides and causing an increase in thin oxide failure problems. One transistor dynamic cells using PN junction capacitors instead of MOS capacitors eliminate a large part of the thin oxide, but processes previously used for this purpose resulted in cell sizes which were too large for present density requirements.

The double-level polysilicon process which is widely used for semiconductor memory manufacture produces access transistors for one-transistor cells wherein the channel length is dependent upon mask alignment. This fact causes variations in the characteristics of access transistors, and again this problem increases as the transistor size is scaled down.

Another problem in prior dynamic memory cells is errors induced by ambient alpha particles. Storage capacitors can be discharged by this radiation, causing "soft" errors.

It is the principal object of this invention to provide an improved method of making dynamic read/write memory devices. Another object is to provide an improved manufacturing method for semiconductor devices of reduced cell size. An additional object is to provide a dense array of memory cells, made by a more reliable method, particularly with reduced thin oxide failures. A further object is to provide an improved way of making capacitors in memory cells. Another object is to provide alpha particle protection in memory cells.

SUMMARY OF THE INVENTION

In accordance with an illustrative embodiment of the invention, a dynamic read/write memory cell of the one transistor N-channel silicon gate type is made by an improved process employing selective oxidation of polysilicon, to form PN junction capacitors. A relatively flat surface results from the process, which is favorable to patterning small geometries. The PN junction storage capacitors have improved alpha particle protection. Metal-to-polysilicon gate contacts are made at silicide areas over polysilicon gates; the silicide lowers resistance of the poly elements.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompany drawings, wherein:

DETAILED DESCRIPTION OF SPECIFIC EMBODIMENTS

Figure 1:
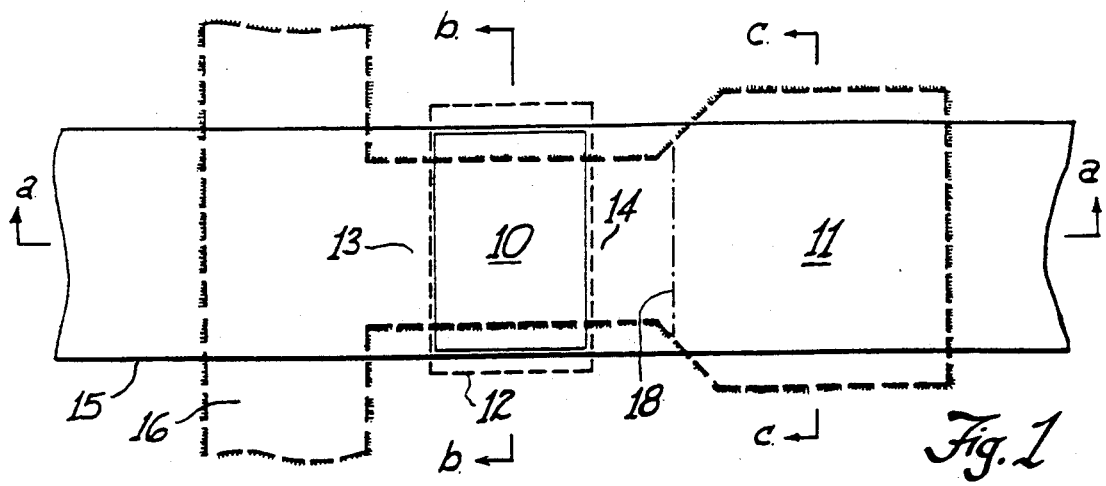
FIG. 1 is a greatly enlarged plan view of a small portion of a semiconductor chip showing the physical layout of a part of a cell array employing memory cells made according to the invention.
Figure 2:
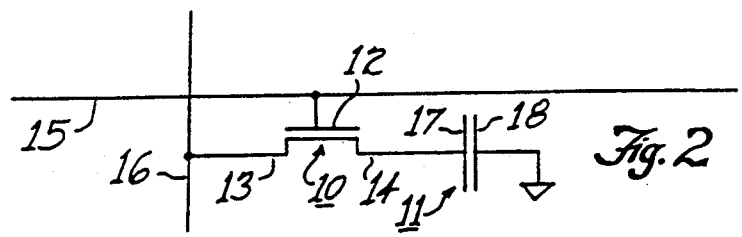
FIG. 2 is an electrical schematic diagram of the part of the cell array of FIG. 1.

The reference to FIGS. 1, 2 and 3a-3c, a one-transistor dynamic memory cell is illustrated which is made according to the invention. A memory device would usually consist of an array of a large number of cells, but only one is shown. Each cell includes an insulated gate field effect transistor 10, and a PN junction storage capacitor 11. The transistor 10 has a polysilicon gate 12, a source 13 and a drain 14. The gate 12 is connected to elongated metal strip 15 which is one of the X or word address lines for the array. The source 13 is part of an elongated N+diffused moat region 16 which is one of the bit lines or Y output lines. The capacitor 11 includes an upper plate 17 which is part of the N+drain region 14, while the lower plate of the capacitor 11 is created by a P+region 18 in a P- epitaxial layer 19, all on a P+substrate 20.

A thin gate oxide layer 21 separate the polysilicon gate 12 from the silicon surface, and no other thin oxide is needed in the cell array, contrary to the large MOS capacitor now widely used in dynamic RAMs. A layer 22 of phosphorus-doped silicon oxide created by oxidation of polysilicon overlies the moat areas, and is used in creating the N+regions 13, 14, 16, 17 as will be described later. A thick layer 23 of low temperature deposited oxide overlies the layer 22 which was created from polysilicon. A thick thermal field oxide coating 24 covers parts of the bar not occupied by the transistors or N+diffused areas (moat regions), and P+channel stop regions 29 are formed underneath all the thick field oxide.

The array, formed on the P+silicon substrate 20, would typically contain perhaps 64K or 256K bits on a bar less than about 160 mils on a side or 25,000 square mil area, depending upon the bit density. The cell shown would be on a minute part of the substrate, perhaps about one-tenth mil wide. A 64K cell array would require 256 of the metal X address lines 15 and 256 of the N+column or Y lines 16, providing 65,536 bits.

Turning now to FIGS. 4a-4e, process for making the cell array of the invention will be described. The starting material is a slice of P+ monocrystalline silicon, typically four inches in diameter and twenty mils thick, cut on the <100> plane, of a resistivity of about 0.01 to 0.001; on the substrate an epitaxial layer 19 of about 0.4 mil thickness and 40 to 50 ohm-cm resistivity has been grown using standard techniques. As mentioned above, in the FIGURES the portion shown of the bar 20 represents only a very small part of the slice, measured in tenths of mils. After appropriate cleaning, the slice with the epitaxial layer is oxidized by exposing to oxygen in a furnace at an elevated temperature to produce an oxide layer 31 over the entire slice of a thickness of about 1000 Å. Next, a layer 32 of silicon nitride of about 1000 Å is formed over the entire slice by a suitable method such as exposing to an atmosphere of dichlorosilane and ammonia in a reactor. Another thin layer 33 of oxide is applied over the nitride. A coating of photoresist is applied to the entire top surface of the slice, then exposed to ultraviolet light through a mask which defines the desired pattern of the thick field oxide 24 and the P+ channel stops 25. The resist is developed, leaving areas where the oxide 33, nitride 32 then oxide 31 layers are removed by etching. The silicon surface is then etched to produce recessed areas 34 which are for the purpose of producing a relatively flat surface after field oxide growth.

Using photoresist and the oxide-nitride-oxide sandwich as a mask, the slice is subjected to an implant step to produce the channel stop regions; to this end boron atoms are introduced by ion implant into unmasked regions 35 of silicon at the bottom of the recessed areas 34. The regions 35 will not exist in the same form in the finished device, because silicon is consumed in the field oxidation procedure. Usually the slice is subjected to a heat treatment after implant but prior to field oxide growth, as set forth in U.S. Pat. No. 4,055,444 to G. R. Mohan Rao, assigned to Texas Instruments.

The next step in the process is the formation of thermal field oxide 24 by subjecting the slices to steam or an oxidizing atmospheric about 900° to 1000° C. for several hours. This causes a thick field oxide layer 24 to be grown as seen in FIG. 4b, extending into the silicon surface as silicon is consumed upon oxidation. The remaining parts of the nitride layer 32 mask oxidation. The thickness of this layer 24 is about 10,000 Å, the upper surface which is at about the same level as the original silicon surface. The boron doped P+ regions 35 formed by implant are partly consumed, but also diffuse further into the silicon ahead of the oxidation front to produce P+ field stop regions 25 which are much deeper than the original regions 35.

Referring to FIG. 4c, the oxide-nitride-oxide sandwich is patterned by photoresist to remove an area 36 above what is to be the P+ capacitor region 18, then the slice is subjected to a boron deposition and diffusion to produce this P+ region 16 in the P- epi layer 19.

Next the remaining oxide-nitride-oxide sandwich is removed by etchants and the exposed silicon cleaned. The first gate oxide 21 is grown by thermal oxidation to a thickness of about 200 Å. The integrity of this gate oxide is enhanced because no photoresist operation is performed at this point. The threshold voltage of the enhancement mode transistors in the cell array or in the periphery may be adjusted by a blanket, non-masked, ion implant.

As seen in FIG. 4d, a layer 37 of polycrystalline silicon is deposited over the entire slice in a reactor using standard techniques to a thickness of about 2000 Å. This layer is doped with phosphorus by an N+ diffusion to make it highly conductive and to provide a source for the subsequent source/drain doping operation. This polysilicon layer is not patterned in the conventional way using photoresist, but instead is selectively oxidized. A layer of silicon nitride of about 1000 Å thickness is deposited as before, then this layer is patterned using photoresist to leave an area 38 over what is to become the gate 12 of the transistor 10.

The slice is next subjected to a thermal oxidation step at about 1000° C. in steam for about 80 min. to convert the exposed part of the polycrystalline silicon to Sio while at the same time producing the N+ diffused regions 16 and 17 in the silicon surface by the so-called "pile-up" effect. This method is described by Goto, Tikemae and Amamo in International Electron Devices Meeting, 1979, pp. 585-589. As the oxidation front moves down in the polysilicon layer 37, the phosphorus concentration in the unoxidized polysilicon increases substantially because of the segregation coefficient at the $Si/SiO_2$ interface. When the polysilicon is almost oxidized, the phosphorus concentration in the remaining polysilicon is extremely high and the concentration in the thin oxide layer 21 becomes very high. Phosphorus diffusion in silicon oxide is enhanced by this increase in concentration, and significant diffusion through the thin oxide 21 into the silicon occurs by the push effect. This N+ doping does not occur beneath the nitride area 38 so the channel is not doped. The resultant structure is seen in FIG. 4e where the oxide layer 22 has been formed.

A platinum silicide layer 39 is created by converting part of the exposed top surface of the polysilicon gate 12 to a silicide by conventional methods. The purpose of this silicide layer 39 is to reduce the resistance of the gate and its contact.

A contact window (not shown) may be next created. A photoresist operation masks all of the top surface of the slice except areas where metal to silicon contact windows are to exist. Using this photoresist as a mask, the thermal oxide 22 is removed to expose the upper surface of the appropriate N+ region in the periphery, not in the cell array.

A thick layer 23 of phosphorus-doped silicon oxide is deposited by decomposition of silane at a low temperature, about 400° C. This layer 23 insulates the metal level from the polycrystalline silicon where crossovers are needed and is referred to as multi-level oxide or "reflow" oxide.

Figure 3A:
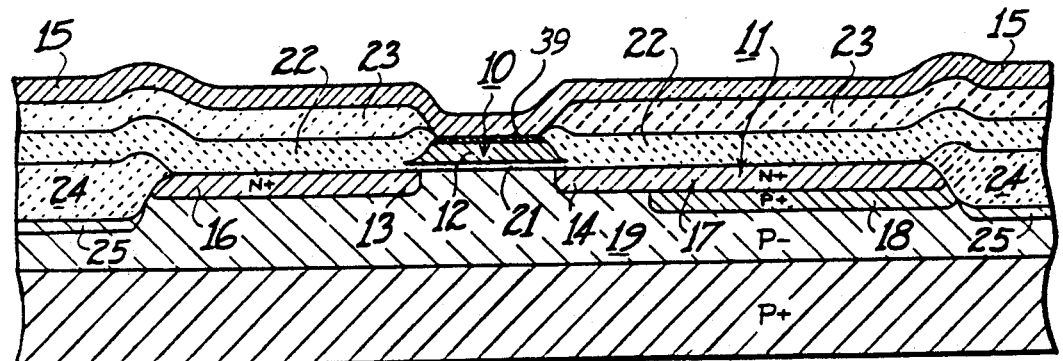
FIGS. 3a-3c are elevation view in section of the cells of FIG. 1, taken along the lines a—a, b—b, and c—c, respectively.
Figure 3B:
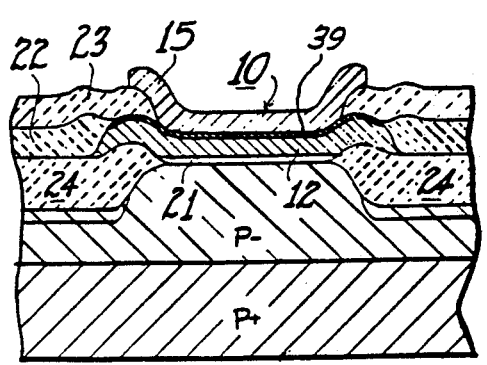
Figure 3C:
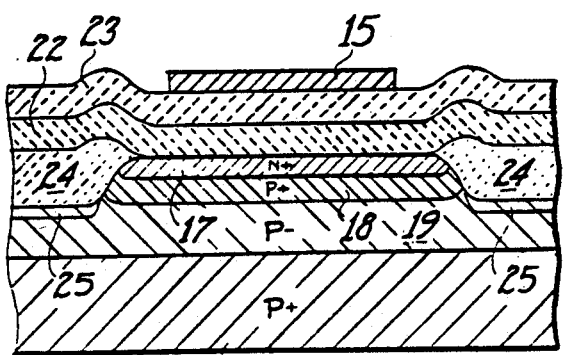
Figure 4:
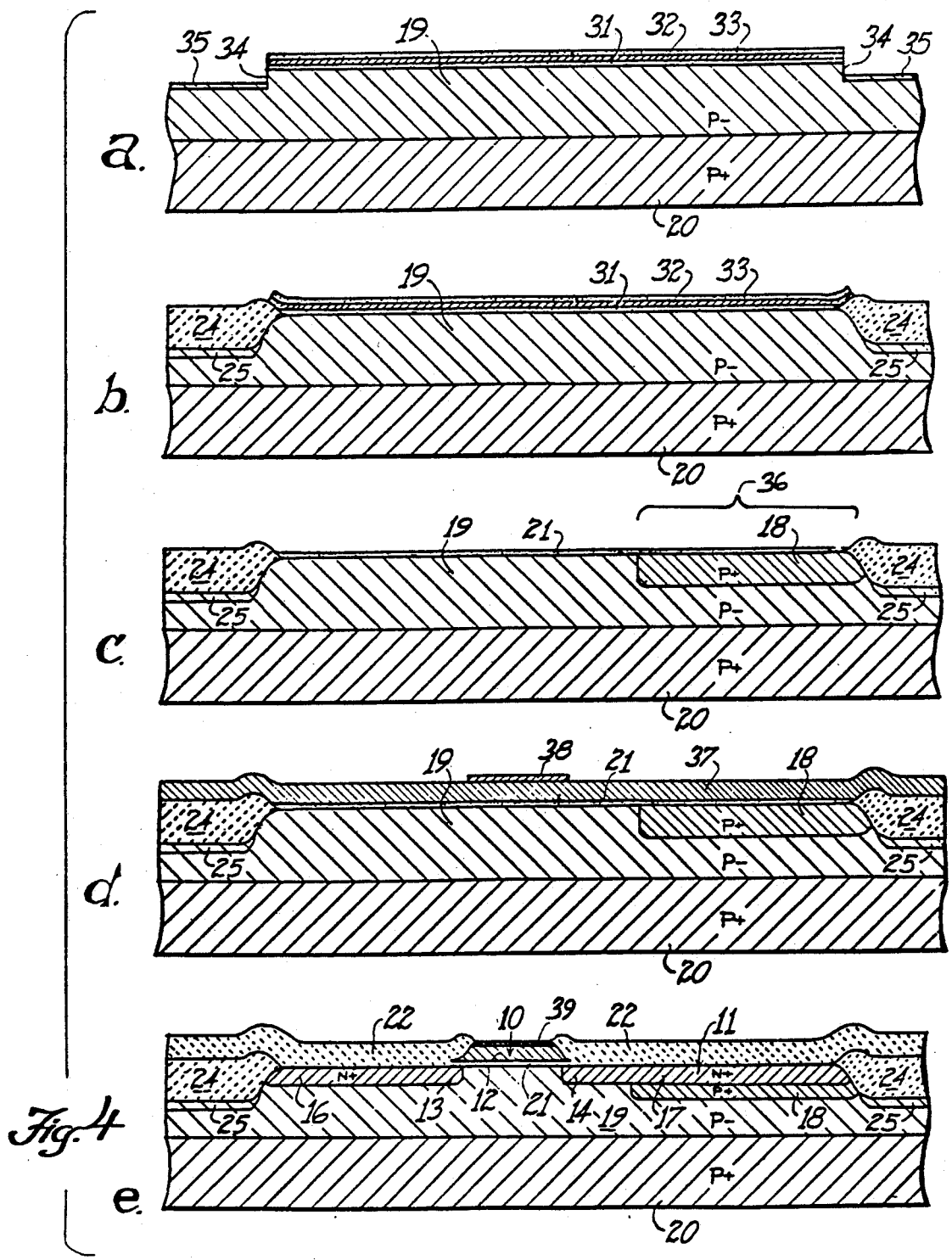
FIGS. 4a-4e are elevation views in section of the cell array of FIGS. 1 and 3a-3c, at successive stages in the manufacturing process, taken generally along the line a—a in FIG. 1.

Referring to FIGS. 1 and 3a, the multi-level oxide layer 23 is now patterned by a photoresist operation, exposing the contact areas 40 for metal-to-polysilicon contacts along the word lines 15 in the cell array (and contact areas for a metal-to-silicon or metal-to-poly contact for peripheral device. These contact windows may be oversized or misaligned with no adverse effects because when the deposited oxide 23 is etched the etching will virtually stop when the thermal oxide 22 is reached. A smooth transition will result with no metal shorts to the underlying N+ regions. Metal contacts and interconnections are used in the periphery of the chip in the input buffers, decoders, sense amplifiers, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves the metal strips 15.

The dynamic RAM cell of FIGS. 1-4 has several advantages. A very large area of a cell array is no longer thin oxide, compared to dynamic RAMs using MOS capacitors, so yield and reliability are increased by an amount corresponding to thin oxide failures in the capacitor gates. Further, the cell has a high degree of alpha particle immunity because of the heavily doped P+layer 18 beneath the storage capacitor 11; this provides a high recombination rate for minority carriers in layer 18 before the carriers reach the storage junction. In addition, the layer 18 provides a potential barrier to minority carriers. This alpha particle immunity is in addition to the advantages of the P+substrate 20 in this regard. It is advantageous that a single level polysilicon process is used instead of the widely used double level poly process; a reduction in the number of conductive layers and photoresist operations usually has a favorable impact on cost and yield. Also, an advantage over the double level poly process is that the channel length of the transistor 10 is not alignment dependent in the process described above. A further advantage is that it is possible to have low impedance double level interconnects by the metal and poly with silicide; this is almost the same as a double level metal system. In the process described, the surface remains essentially flat because of the pre-etched areas 34 and the fact that the poly is oxidized rather than removed; a flat surface is favorable for patterning small geometrics. An additional advantage of the process is that no photoresist steps are performed after gate oxide 21 is grown, ensuring high quality gate oxide.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor dynamic memory device arranged to be connected in an array of dynamic memory devices between one work address line and one bit line, said device comprising:
    a silicon body having a P minus epitaxial layer grown on said body;
    a gate lying within a gate region, connected to said one word address line for the array, said gate being formed at least by applying a gate oxide layer on said epitaxial layer and forming a conductive layer including a silicide material over the gate oxide for connection to said one word address line;
    a channel formed in said epitaxial layer below said gate by using a mask over the gate region to mask a portion of said epitaxial layer against doping;
    a source and a drain formed on opposite sides of said gate and said channel in said epitaxial layer, said source and drain being parts of respective source and drain regions that are formed, at least in part, by using the mask over the gate region to place N plus dopant into said epitaxial layer on both sides of said gate and channel, said drain being of substantially even thickness;
    a storage capacitor including a PN junction spaced laterally from said channel and formed by a second masking step diffusing a P plus dopant into a portion of the epitaxial layer and below part of what will be one of the source and drain regions; and
    a connection between the other of the source and drain regions to said one bit line.

2. The device of claim 1 in which said PN junction if formed by diffusing said N plus dopant into said epitaxial layer above said P plus dopant to concentrate said P plus dopant in said epitaxial layer.

3. The device of claim 1 in which said PN junction occurs between said portion of the epitaxial layer containing the P plus dopant and said drain, and said connection is between said source and said one bit line.

4. The device of claim 1 in which said silicon body includes a P plus substrate below said epitaxial layer.

5. The device of claim 1 in which said N plus dopant is phosphorus.

6. The device of claim 1 in which said P plus dopant is boron.

7. The device of claim 1 in which said gate oxide is about 200 Angstroms thick.

8. The device of claim 1 in which said gate conductive layer includes platinum silicide material.

9. The device of claim 1 in which said gate is formed by growing through thermal oxidation a gate oxide layer on said epitaxial layer, depositing a layer of polycrystalline silicon over said gate oxide layer, doping the polycrystalline silicon with a N plus dopant to make it more conductive, applying a mask over the gate region of the polycrystalline silicon, thermally oxidizing said doped polycrystalline silicon on both sides of said gate region to form silicon oxide and diffuse said N plus dopant into said epitaxial layer below said silicon oxide on both sides on said gate region to form at least parts of said source and drain regions, removing the mask, and forming said silicide material in the polycrystalline silicon in the gate region.

10. The device of claim 9 including a layer of oxide deposited at low temperature over said thermally oxidized and doped polycrystalline silicon.

* * * * *